(12) United States Patent
Lin

(10) Patent No.: US 10,117,355 B2
(45) Date of Patent: Oct. 30, 2018

(54) HEAT DISSIPATION FOIL AND METHODS OF HEAT DISSIPATION

(71) Applicant: Chhiu-Tsu Lin, Sycamore, IL (US)

(72) Inventor: Chhiu-Tsu Lin, Sycamore, IL (US)

(73) Assignee: Chemnova Technologies, Inc., Sycamore, IL (US)

( * ) Notice: Subject to any disclaimer, the term of this patent is extended or adjusted under 35 U.S.C. 154(b) by 0 days.

(21) Appl. No.: 15/250,164

(22) Filed: Aug. 29, 2016

(65) Prior Publication Data

US 2018/0063995 A1 Mar. 1, 2018

(51) Int. Cl.
*H01L 23/373* (2006.01)
*H05K 7/20* (2006.01)

(52) U.S. Cl.
CPC ....... *H05K 7/20427* (2013.01); *H01L 23/373* (2013.01)

(58) Field of Classification Search
CPC .... H05K 7/20427; F28F 21/06; F28F 21/084; F28F 21/085
USPC ............... 361/704; 428/411.1, 500
See application file for complete search history.

(56) References Cited

U.S. PATENT DOCUMENTS

| | | | |
|---|---|---|---|
| 5,322,870 A | 7/1994 | Strickler | |
| 6,362,960 B1 * | 3/2002 | Ducourt | H05K 7/20172 361/695 |
| 6,649,090 B2 | 11/2003 | Funaki et al. | |
| 6,956,739 B2 * | 10/2005 | Bunyan | H01L 23/4275 257/E23.089 |
| 7,015,280 B2 | 3/2006 | Lin | |
| 7,556,850 B2 * | 7/2009 | Ikishima | C09J 133/08 174/259 |
| 7,931,969 B2 | 4/2011 | Lin | |
| 8,545,933 B2 | 10/2013 | Lin | |
| 8,922,970 B2 * | 12/2014 | Hebert | B64C 1/12 361/216 |
| 2003/0151030 A1 | 8/2003 | Gurin | |
| 2004/0001298 A1 * | 1/2004 | Henricks | H01B 17/16 361/118 |
| 2004/0069454 A1 | 4/2004 | Bonsignore et al. | |
| 2005/0179010 A1 | 8/2005 | Lin | |
| 2007/0069373 A1 | 3/2007 | Roth | |
| 2007/0166551 A1 * | 7/2007 | Lin | H01L 23/373 428/423.1 |
| 2011/0101408 A1 * | 5/2011 | Hung | H01L 33/20 257/99 |
| 2011/0232300 A1 | 9/2011 | Lin | |
| 2013/0329366 A1 * | 12/2013 | Wang | H05K 7/20963 361/704 |

(Continued)

OTHER PUBLICATIONS

Eyassu, T. et al., "Molecular cooling fan: Factors for optimization of heat dissipation devices and applications", Industrial & Engineering Chemistry Research, vol. 53, pp. 19550-19558, (2014).

(Continued)

*Primary Examiner* — Mandeep S Buttar
(74) *Attorney, Agent, or Firm* — Evan Law Group LLC

(57) ABSTRACT

A heat dissipation foil comprises a flexible substrate, a molecular fan film and an adhesive. The flexible substrate has a working surface and an adhesive surface, opposite the working surface. The molecular fan film is on the working surface. The adhesive is on the adhesive surface.

20 Claims, 8 Drawing Sheets

(56) References Cited

U.S. PATENT DOCUMENTS

2015/0092351 A1* 4/2015 Chowdhury ............ F28F 21/06
                                                          361/704
2015/0118482 A1* 4/2015 Kagawa .................. B32B 27/08
                                                          428/323

OTHER PUBLICATIONS

Hsiao, T-J. et al., "Monolayer graphene dispersion and radiative cooling for high power LED", Nanotechnology, vol. 24, No. 39, pp. 1-10, (2013).
Suryawanshi, C.N. et al., "Radiative cooling: Lattice quantization and surface emissivity in thin coatings", Applied Materials & Interfaces, vol. 1, No. 6, pp. 1334-1338, (2009).
Yung, K.C., "Using metal core printed circuit board (MCPCB) as a solution for thermal management", Journal of the HKPCA, vol. 24, pp. 12-16, (2007).
Sizemore, C.A. et al., "Molecular Fan: A heat sink for nanoelectronic devices", NSTI-Nanotech 2005, vol. 2, pp. 339-342, (2005).

\* cited by examiner

HEAT DISSIPATION FOIL AND METHODS OF HEAT DISSIPATION

BACKGROUND

There are three general mechanisms by which an object can release heat energy: conduction, convection and radiation. In conduction, heat is transferred within a substrate. In convection, a hot region of a gas or liquid moves away from the source of heat and is replaced by cool media. In radiation, energy is emitted as photons or electromagnetic waves without a medium.

Heat dissipation is a significant concern for electronic devices. Poor thermal management can reduce the efficiency and performance of electronic devices. For example, overheating may cause displays to be dimmer and processors to operate more slowly. Extended overheating can impair reliability, cause device malfunctions and may ultimately result in premature device failure. Heat generation may also cause discomfort to users of portable electronic devices because the heat generated within the device can raise the surface temperature and injure the user's skin.

Conduction and convection have been extensively used for thermal management of electronic devices. Heat sinks are well-known devices that provide conductive cooling. Convective cooling is typically achieved with mechanical fans. Conduction and convection may be paired together, such as by including heat sinks and mechanical fans within the tower of a desktop computer.

Conduction and convection are often not suitable for small electronic devices due to the sizes of the conductive and convective cooling devices. Devices such as heat sinks and mechanical fans occupy a large proportion of the available space in electronic devices and are difficult to physically integrate into smaller items such as cellular phones, LEDs and tablet computers.

A film that dissipates heat of a surface to which it is applied by enhanced radiative cooling, referred to as a "molecular fan", has been previously described in U.S. Pat. Nos. 7,931,969 and 8,545,933 as a heat dissipation device for use in electronic devices. A molecular fan is a coating that may be applied to a surface to increase substrate surface emissivity and thus to enhance "active" heat dissipation by radiation. The molecular fan takes advantage of the high emissivity in the infra-red of discrete molecules (as opposed to extended solids) which result from transitions between different vibrational states. The molecular fan includes particles to increase surface area, and materials on the surface of the coating that will radiate infra-red light as they transition between different vibrational states. An emulsion that hardens upon curing is also included in a molecular fan coating material, to adhere the particles and other materials on the surface being coated. The molecular fan coating provides good surface hardness, provides resistance to fingerprints, inhibits corrosion and is easy to clean.

Thermal management becomes even more difficult in environments where air is unable to freely circulate, thus inhibiting convection. Confined spaces produce a pocket of air, referred to as an "air gap", which acts as an insulator and traps heat. The tendency of manufacturers to produce smaller and thinner electronic devices concentrates the heat generated by the internal components and promotes the formation of these insulating air gaps. Insulating air gaps can also be formed in locations where electronic devices are mounted.

Various cooling techniques that have been used in small electronic devices include heat pipes, phase change materials (PCMs), Peltier devices, microscale ionic "winds" and heat spreaders (sheets or films of substances with relatively high thermal conductivity such as metals and graphite). These cooling techniques were found to provide insufficient heat dissipation, and to be too expensive or complicated to manufacture for commercial use.

SUMMARY

In a first aspect, the invention is a heat dissipation foil comprising a flexible substrate, a molecular fan film and an adhesive. The flexible substrate has a working surface and an adhesive surface, opposite the working surface. The molecular fan film is on the working surface. The adhesive is on the adhesive surface.

In a second aspect, the invention is an electronic device having a confined space, comprising a molecular fan film in contact with the confined space.

In a third aspect, the invention is an electronic device in a low pressure environment, comprising a molecular fan film in contact with the low pressure environment.

In a fourth aspect, the invention is a method of making a heat dissipating foil, comprising forming an uncured molecular fan material; applying the uncured molecular fan material to a working surface of a flexible substrate; curing the uncured molecular fan material to form a molecular fan film on the working surface of the flexible substrate; and applying an adhesive to an adhesive surface of the flexible substrate.

In a fifth aspect, the invention is a method of making an electronic device having enhanced heat dissipation, comprising adhering a heat dissipation foil to the electronic device.

In a sixth aspect, the invention is an electronic device comprising a heat dissipation foil.

DEFINITIONS

The term "molecular fan film" means a film that dissipates heat of a surface to which it is applied by enhanced radiative cooling, as described in U.S. Pat. Nos. 7,931,969; 8,545,933; Hsiao, T-J. et al., "Monolayer graphene dispersion and radiative cooling for high power LED", Nanotechnology, vol. 24 (2013); Eyassu, T. et al., "Molecular cooling fan: factors for optimization of heat dissipation devices and applications", Industrial & Engineering Chemistry Research, vol. 53, pp. 19550-19558 (2014); and Suryawanshi, C. N. et al., "Radiative cooling: lattice quantization and surface emissivity in thin coatings", Applied Materials & Interfaces, vol. 1, no. 6, pp. 1334-1338 (2009). A molecular fan film may be formed by curing or drying an uncured molecular fan material.

The term "uncured molecular fan material" means a fluid that may be cured or dried to form a molecular fan film.

The term "air gap" means a pocket of air that acts as an insulator.

The term "confined space" means an enclosed area having at least one, or preferably at least two, dimensions that are at most 10 μm.

The term "low pressure environment" means an environment with a pressure of at most 0.5 atm.

The term "mobile phone" means any portable telephone and includes cellular phones, smart phones and phone/tablet combination devices (also known as a "phablet").

All percentages (%) are weight/weight percentages, unless stated otherwise.

BRIEF DESCRIPTION OF THE DRAWINGS

The invention can be better understood with reference to the following drawings and description.

DETAILED DESCRIPTION

Radiative cooling offers the potential to solve the problem of heat dissipation in small electronic devices. A significant advantage of transferring energy by radiation is that, unlike conduction, which is directly proportional to the temperature difference between the hot and cold regions, and convection, which is dependent on diffusion, radiation transfer of energy is proportional to $T^4$ (T is the absolute temperature of heat source). This means that doubling the heat source temperature can have the effect of increasing the power emitted by $2^4$, or sixteen times the energy dissipated at the original temperature. Radiative cooling works particularly well in small devices because it is spaceless, requires no power source and can transfer heat across air gaps.

The present invention includes a heat dissipation foil that has a flexible substrate, a molecular fan film, an adhesive and, optionally, a removable liner. The heat dissipation foil may be used in confined spaces, such as in electronic devices having an air gap. The thin size of the heat dissipation foil is particularly useful in devices such as mobile phones, tablets, metal core printed circuit boards, light emitting diodes (LEDs) and liquid crystal displays (LCDs). The heat dissipation foil is also useful in low pressure environments, such as those encountered in aerospace applications.

An important feature of the heat dissipation foil is that it is simple to include in an electronic device. The heat dissipation foil may be easily added to an existing electronic device by a user. Alternatively, manufacturers may easily integrate the installation of a heat dissipation foil to existing manufacturing process for electronic devices. Importantly, the heat dissipation foil is compatible with all electronic devices produced by any manufacturer, and avoids the difficulty of handling and applying an uncured molecular fan material.

The present invention also includes methods of heat dissipation with a molecular fan film in confined spaces, and methods of heat dissipation with a molecular fan in low pressure environments. The molecular fan film may be included as part of a heat dissipation foil, or may be directly applied to a surface without a flexible substrate or adhesive.

Figure 1:
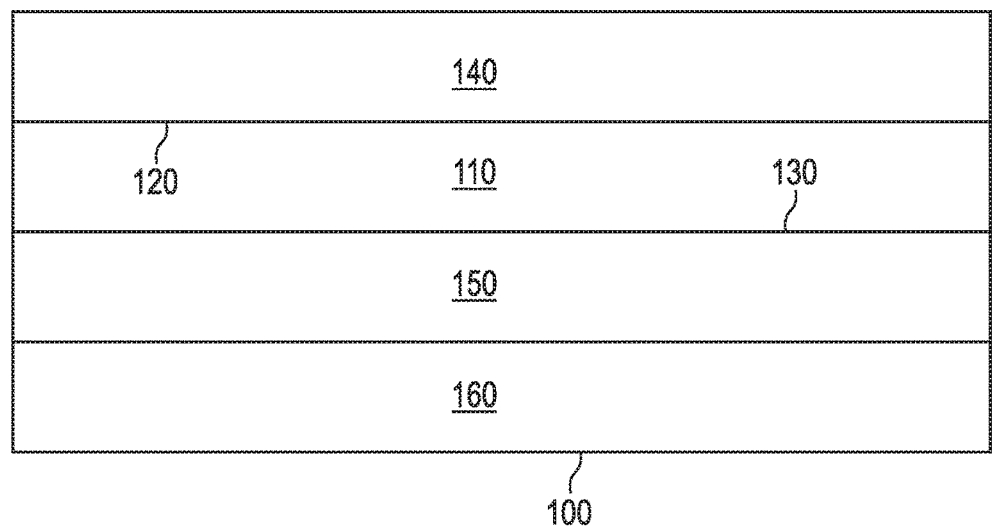
FIG. 1 illustrates a heat dissipation foil.

FIG. 1 illustrates a heat dissipation foil 100. The heat dissipation foil includes a flexible substrate 110, having a working surface 120 and an adhesive surface 130, opposite the working surface. A molecular fan film 140 is on the working surface of the flexible substrate. An adhesive 150 is on the adhesive surface of the flexible substrate. A removable liner 160 is optionally on the adhesive, when the adhesive is a pressure-sensitive adhesive.

The flexible substrate may be a metal, plastic or silicate mineral. Suitable metals include good conductors, such as aluminum, copper, silver and gold. Preferably, the metal is provided as a metal foil, such as aluminum foil or copper foil available from All Foils, Inc. (Strongsville, Ohio). Suitable plastics include polyethylene terephthalate (PET) and polyimides, such as polyimides sold under the KAPTON® trademark by DuPont (Wilmington, Del.). Suitable silicate minerals include mica. Metal substrates may have a thickness of at most 100 μm, preferably a thickness of 10-60 μm, including 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 35 μm, 40 μm, 45 μm, 50 μm and 55 μm. Plastic and silicate mineral substrates may have a thickness of at most 50 μm, preferably have a thickness of 5-40 μm, including 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 35 μm and 40 μm. Preferably, the plastic substrate is thin enough to prevent the plastic from acting as an insulator.

The molecular fan film is located on the working surface of the flexible substrate and forms an outer surface of the heat dissipation foil. Molecular fans are described in greater detail in U.S. Pat. Nos. 7,931,969 and 8,545,933. The molecular fan film includes materials that will radiate infrared light as they transition between different vibrational states. The molecular fan film may include particles to increase the surface area of the film. An emulsion that hardens upon curing is included in the uncured molecular fan material, to adhere the particles and other materials to the surface being coated. The molecular fan film may have a thickness sufficient to provide heat dissipation, for example, 25 μm. Preferably, the molecular fan film coating is electrically insulating.

The molecular fan film preferably contains materials that have high thermal conductivity, high thermal diffusivity, low coefficient of thermal expansion and/or a low density. Suitable materials include carbon nanotubes, including single-walled carbon nanotubes (also known as SWNT or SWCNT) and multi-walled carbon nanotubes (also known as MWNT or MWCNT), nanodiamond powder (NDP), carbon black, zinc oxide (ZnO), boron nitride, such as hexagonal boron nitride (hBN),an d graphene. The materials may be chemically treated, such as by encapsulation. A preferred material is highly encapsulated monolayer graphene. Preferred molecular fan films contain well-dispersed graphene and/or carbon nanotubes.

The molecular fan film may be formed by preparing an uncured molecular fan material, followed by curing or drying. An uncured molecular fan material may be formed by dispersing materials in a solvent to form a suspension, followed by mixing the suspension with an emulsion. The solvent may be aqueous, or may be non-aqueous, such as N-methyl-2-pyrrolidone (NMP). The suspension may optionally include a surfactant, such as sodium dodecylbenzenesulfonate (SDBS). Additional materials, such as co-solvents, surface wetting agents and fillers may optionally be added to the uncured molecular fan material. The preparation of preferred molecular fan films is described in greater detail in Hsiao, T-J. et al., "Monolayer graphene dispersion and radiative cooling for high power LED", Nanotechnology, vol. 24 (2013); Eyassu, T. et al., "Molecular cooling fan: factors for optimization of heat dissipation devices and applications", Industrial & Engineering Chemistry Research, vol. 53, pp. 19550-19558 (2014); and Suryawanshi, C. N. et al., "Radiative cooling: lattice quantization and surface emissivity in thin coatings", Applied Materials & Interfaces, vol. 1, no. 6, pp. 1334-1338 (2009). The references describe the preparation of exemplary molecular fan films containing carbon nanotubes and graphene.

An uncured molecular fan material may be applied to the flexible substrate by any suitable liquid application process, such as spray coating, dip coating or draw-bar coating. After applying the uncured molecular fan material to the flexible substrate, the uncured molecular fan material may be air dried or thermally cured, such as by heating at 80-130° C. for 3-10 minutes, to form the molecular fan film.

The adhesive is located on the adhesive surface of the flexible substrate. Any suitable adhesive may be used in the heat dissipation foil, such as emulsions, epoxies, urethanes, acrylates and acrylics. The adhesive may have a thickness sufficient to provide adhesion to the surface to which the foil is applied, for example, 20 µm. Preferably, the adhesive and the flexible substrate together have a thickness that avoids creating a thermal barrier. The adhesive is preferably thermally conductive. Also preferred is a pressure-sensitive adhesive, more preferably a thermally conductive pressure-sensitive adhesive.

Preferred pressure-sensitive adhesives include emulsions, such as acrylic emulsions. Suitable pressure-sensitive adhesives include the emulsions sold under the ENCOR® trademark by Arkema Coatings Resins (Cary, N.C.). These include ENCOR® 327, ENCOR® 9042, ENCOR® 9043, ENCOR® 9046, ENCOR® 9144, ENCOR® 9165, ENCOR® 9290, ENCOR® 9291, ENCOR® 9569, ENCOR® 9801 and ENCOR® 9285.

The adhesive may optionally be thermally conductive, but electrically insulating. An adhesive may be made thermally conductive by the inclusion of one or more thermally conductive materials. Suitable conductive materials include metals, such as gold, silver, copper and aluminum, boron nitride, such as hexagonal boron nitride, zinc oxide and carbon materials, such as carbon nanotubes, nanodiamond powder, carbon black and graphene. The conductive materials may be present in an amount of 1-10 wt % of the adhesive. The proportion of conductive material to adhesive may be varied to achieve a desired thermal conductivity, with a film resistance of Mohms. For example, a thermally conductive pressure-sensitive adhesive may be formed by mixing ⅓ ENCOR® 9285 acrylic emulsion with ⅔ 6% carbon nanotubes in water.

The optional removable liner may be present when the heat dissipation foil includes a pressure-sensitive adhesive. The removable liner protects the pressure-sensitive adhesive prior to use for adhere to an electronic device or other surface. The removable liner is located on the pressure-sensitive adhesive and forms the other outer surface of the heat dissipation foil. The removable liner may be paper or a plastic film. The removable liner has a thickness sufficient to protect the pressure-sensitive adhesive and be easily removed, for example, 50-70 µm.

Figure 2:
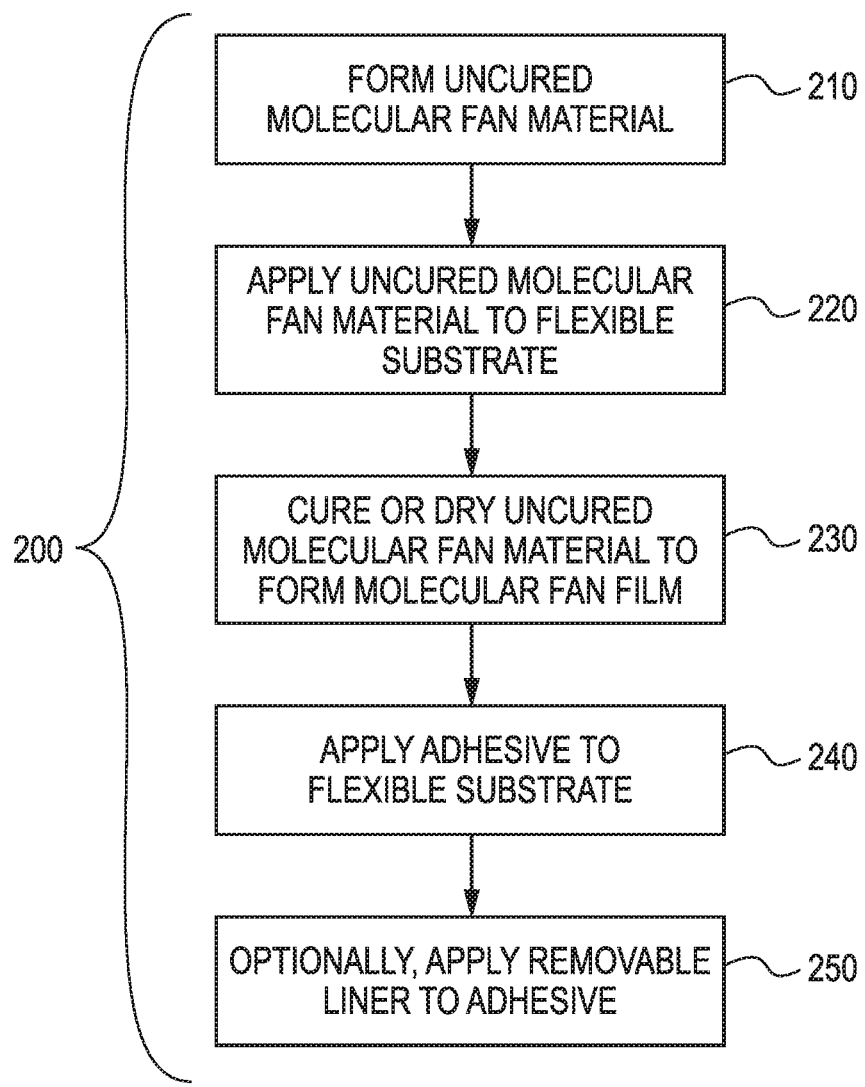
FIG. 2 illustrates a method of making a heat dissipating foil.

FIG. 2 illustrates a method of making a heat dissipating foil at 200. First, an uncured molecular fan material is formed at 210. Next, the uncured molecular fan material is applied to the working surface of a flexible substrate (top) at 220. Then, the uncured molecular fan material is cured or dried to form a molecular fan film at 230. An adhesive is then applied to the adhesive surface of the flexible substrate (bottom) at 240. A removable liner may optionally be applied to the adhesive at 250. The order of assembly may be varied. The heat dissipation foil may be inexpensively assembled from commercially-available components.

Multiple components of the heat dissipating foil may be integrated as single commercially-available products. For example, the flexible substrate may be supplied with a pressure-sensitive adhesive and a removable liner affixed to the adhesive surface. Similarly, a pressure-sensitive adhesive may be supplied as a double-sided tape that includes two removable liners, such that one removable liner may be removed to affix the pressure-sensitive adhesive to the adhesive surface of the flexible substrate, forming a flexible substrate with a pressure-sensitive adhesive and a removable liner. The use of such integrated components may reduce the steps required to assemble a heat dissipating film.

Figure 3:
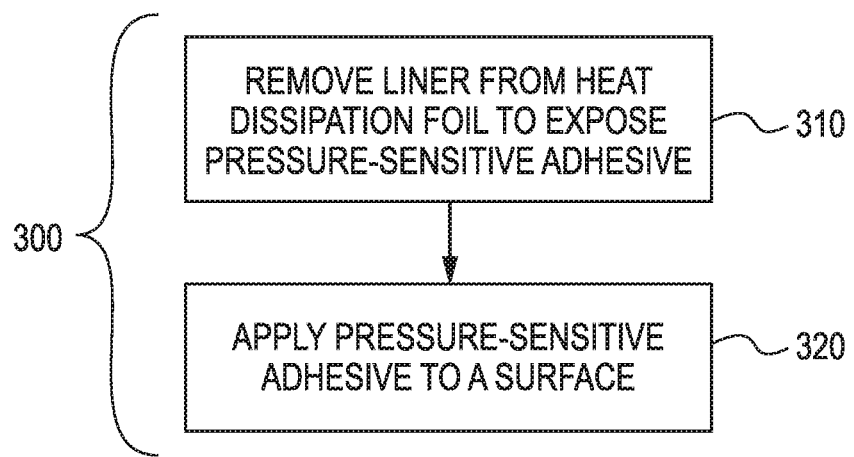
FIG. 3 illustrates a method of dissipating heat with a heat dissipation foil.

FIG. 3 illustrates a method of dissipating heat with a heat dissipation foil including a pressure-sensitive adhesive and a removable liner at 300. First, the removable liner is removed from the heat dissipation foil to expose the pressure-sensitive adhesive at 310. Next, the pressure-sensitive adhesive is applied to a surface at 320.

The heat dissipation foil may be applied to any surface that requires heat dissipation. For example, the heat dissipation foil may be applied to electronic devices such as desktop computers, notebook computers, tablet computers, television sets, video gaming consoles, mobile phones, liquid crystal displays (LCDs), printed circuit boards (PCBs), metal core printed circuit boards (MCPCBs), light emitting diodes (LEDs) and high brightness light emitting diodes (HBLEDs); preferably, the heat dissipation foil is applied on surfaces which are surrounded by an external housing, to transfer heat from the internal surface to the external housing. The heat dissipation foil may also be applied to other heat dissipating devices, such as a heat spreader, to increase its heat dissipating abilities. Importantly, the heat dissipation foil is universally compatible and may be applied to any device produced by any manufacturer.

Figure 8:
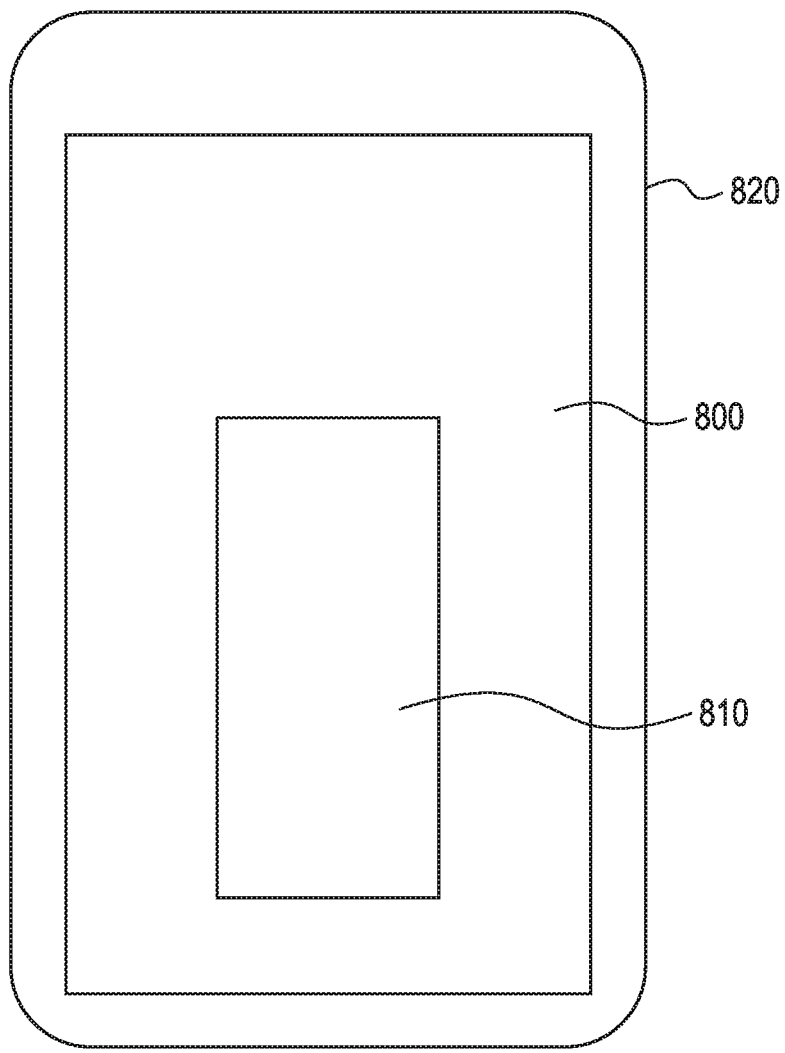
FIG. 8 illustrates a heat dissipation foil applied around a battery of a cellular phone.

The heat dissipation foil may be applied to any suitable location of a surface that requires heat dissipation. For example, in a mobile phone, a heat dissipating foil may be applied to one or both sides of the battery, to the inner surface of the phone surrounding the battery, to the inside of a removable battery cover or to a microprocessor. Multiple heat dissipation foils may be used within a single device. Preferably, the heat dissipation foil is placed so as not to prevent access to removable components of the electronic device, such as a battery, memory drive or SIM card. FIG. 8 illustrates a heat dissipation foil 800 applied around a battery 810 of a cellular phone 820. The heat dissipation foil may also be applied to accessories that physically contact a surface that generates heat. Examples of accessories include cases for cellular phones, docking stations and automobile dashboard mounts.

The heat dissipation foil may be applied to a commercially-available device by a user. For example, a tablet owner may remove the battery cover of her tablet and apply a heat dissipation foil to the inside of the tablet around the battery. The aftermarket application of heat dissipating foils allows users to improve the performance and reliability of their devices.

Alternatively, the heat dissipation foil may be included in the manufacturing process by manufacturers. The heat dissipation foil is easy to integrate into existing manufacturing processes since it only requires affixing the heat dissipation foil to a suitable surface. Including the heat dissipation foil does not require any chemicals, liquids, coatings, hazardous materials or specialized processing environments.

Heat may also be dissipated using a molecular fan film applied directly to a surface, without the use of a flexible substrate and adhesive. A molecular fan film may be applied to a surface that requires heat dissipation in a confined space, which is an enclosed area having at least one dimension, and preferably at least two dimensions, that are at most 10 μm, including dimensions that are at most 5 μm and dimensions that are at most 1 μm. Confined spaces are especially difficult to effectively cool due to the formation of an insulating air gap. The molecular fan film is sufficiently thick to provide radiative cooling without being so thick that it interferes with the function of the surface to which it is applied.

A molecular fan film may also be applied to a surface that requires heat dissipation that is or will be exposed to a low pressure environment, which is an environment with a pressure of at most 0.5 atm, including environments with a pressure of at most 0.25 atm, environments with a pressure of at most 0.1 atm and vacuum environments. Low pressure environments are often encountered in aerospace and outer space applications. Heat dissipation foils may also be applied to confined spaces and/or used in low pressure environments.

In addition to radiating heat, the molecular fan film is a dielectric material. This property allows the heat dissipation foil to serve as a substrate for other devices. For example, the heat dissipation foil could replace the metal base plate found in metal core printed circuit boards.

EXAMPLES

Example 1

Comparative Test of Heat Dissipation Foil and Graphite Heat Dissipating Film in a Mobile Phone A heat dissipation foil having a molecular fan film including carbon nanotubes, an aluminum foil flexible substrate and a pressure-sensitive adhesive was prepared. A graphite heat dissipating film was used as a comparison. The heat dissipating foil and the graphite film were applied to the inner surface of a SAMSUNG® cellular phone after removing the back cover. The back cover was then reapplied, creating a confined space in contact with the molecular fan film. A cellular phone with no heat dissipating materials was included as a control.

The phones were heated by constant external heat in an oven. The central processing unit (CPU) of the cellular phones was measured using the "Cpu Temperature" application available on the GOOGLE PLAY™ store. The cooling effect of the heat dissipation foil and the graphite film were compared by measuring the CPU temperature while heating the phones for 16 minutes. Table 1 below shows the temperature of the CPU for the control phone and the phone with the heat dissipation foil including a molecular fan film coating:

TABLE 1

| Control vs. heat dissipation foil | | |
|---|---|---|
| Minutes | Control (° C.) | Heat dissipation foil (° C.) |
| 0 | 41 | 40 |
| 3 | 54 | 49 |
| 6 | 59 | 54 |

TABLE 1-continued

| Control vs. heat dissipation foil | | |
|---|---|---|
| Minutes | Control (° C.) | Heat dissipation foil (° C.) |
| 8 | 62 | 56 |
| 10 | 62 | 59 |
| 11 | 63 | 60 |
| 12 | 65 | 60 |
| 14 | 65 | 61 |
| 16 | 67 | 62 |

Table 2 below shows the temperature of the CPU for the control phone and the phone with the graphite film:

TABLE 2

| Control vs. graphite film | | |
|---|---|---|
| Minutes | Control (° C.) | Graphite Film (° C.) |
| 0 | 33 | 32 |
| 2 | 45 | 41 |
| 4 | 52 | 48 |
| 6 | 56 | 53 |
| 8 | 59 | 56 |
| 10 | 63 | 58 |
| 12 | 63 | 62 |
| 14 | 65 | 61 |
| 16 | 67 | 64 |

Figure 4A:
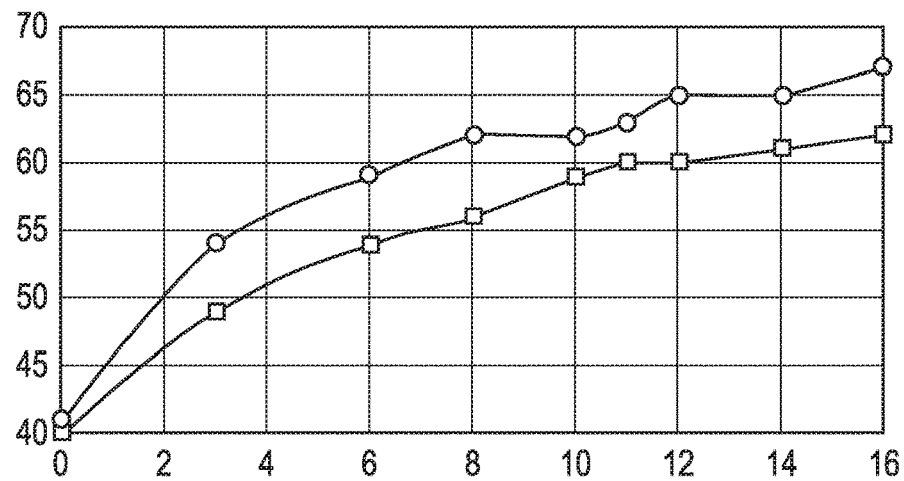
FIG. 4A illustrates the cooling effect of a heat dissipation foil on a cellular phone.
Figure 4B:
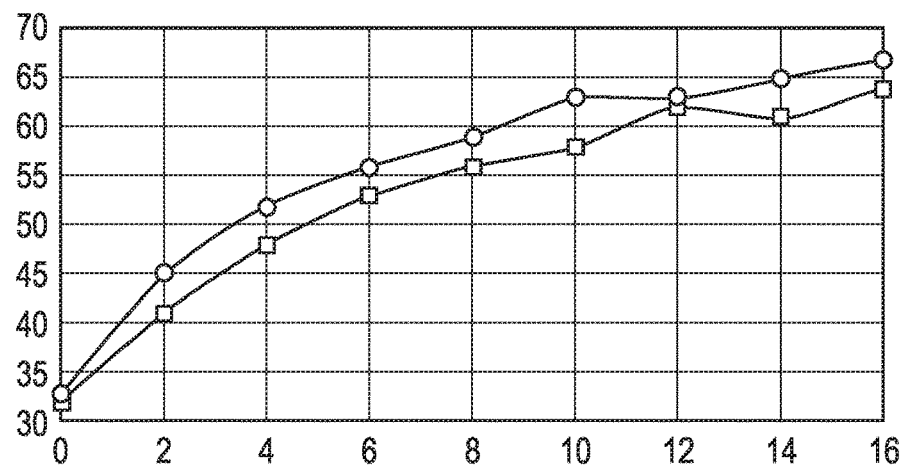
FIG. 4B illustrates the cooling effect of a graphite film on a cellular phone.

FIG. 4A illustrates the data shown in Table 1. FIG. 4B illustrates the data shown in Table 2. The results indicate that the heat dissipation foil provides 5-6° C. of cooling while the graphite film provides 3-4° C. of cooling.

Example 2

Heat Dissipation Stress Test

A stress test was performed by heating an OPPO® cellular phone for 15 minutes followed by cooling the phone for 15 minutes. The phone was heated by running a global positioning system (GPS) application. A heat dissipation foil with a molecular fan film including carbon nanotubes was applied to the inside of the phone after removing the back cover. The back cover was then reapplied, creating a confined space in contact with the molecular fan film. A cellular phone with no heat dissipating foil was included as a control. The outer (skin) temperature of the phone was measured with a thermocouple. The stress test was carried out using the Antutu version 6.1.4 program.

Figure 5:
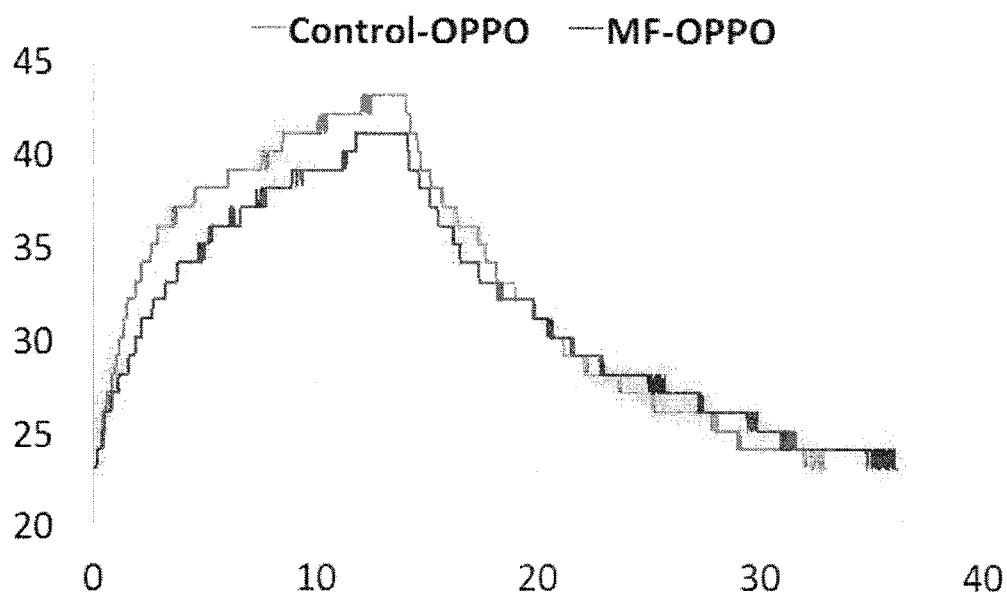
FIG. 5 illustrates the results of a heat dissipation stress test.

FIG. 5 illustrates the results of the stress test. The stress test indicated that the heat dissipation foil provided 2-3° C. of cooling.

Example 3

Comparative Test of Heat Dissipation Foils and Commercially-Available Heat Dissipating Foil A heat dissipation foil having a molecular fan film including carbon nanotubes, a copper foil flexible substrate and a pressure-sensitive adhesive was prepared. A second heat dissipation foil having a molecular fan film including carbon nanotubes, an aluminum foil flexible substrate and a pressure-sensitive adhesive was prepared. The heat dissipation foils were applied to Q-Lab Q-PANEL® aluminum standard test substrates (Westlake, Ohio). A commercially-available graphite film was applied to a separate Q-PANEL® test substrate as a comparison. An uncoated Q-PANEL® was used as a control. The substrates were heated and the temperature of the substrates was measured. Table 3 below shows the thermal cooling provided by the heat dissipation foil with copper substrate, the heat dissipation foil with aluminum substrate and the graphite film:

TABLE 3

Thermal cooling of heat dissipation foil with copper substrate, heat dissipation foil with aluminum substrate and graphite film

| Material | Control | Heat dissipation foil (Cu) | Heat dissipation foil (Al) | Graphite Film |
|---|---|---|---|---|
| Temperature (° C.) | 130 | 103.8 | 104.7 | 115.8 |
| ΔT (° C.) | N/A | 26.2 | 25.3 | 14.2 |
| % cooling | N/A | 20% | 19% | 11% |

Figure 9:
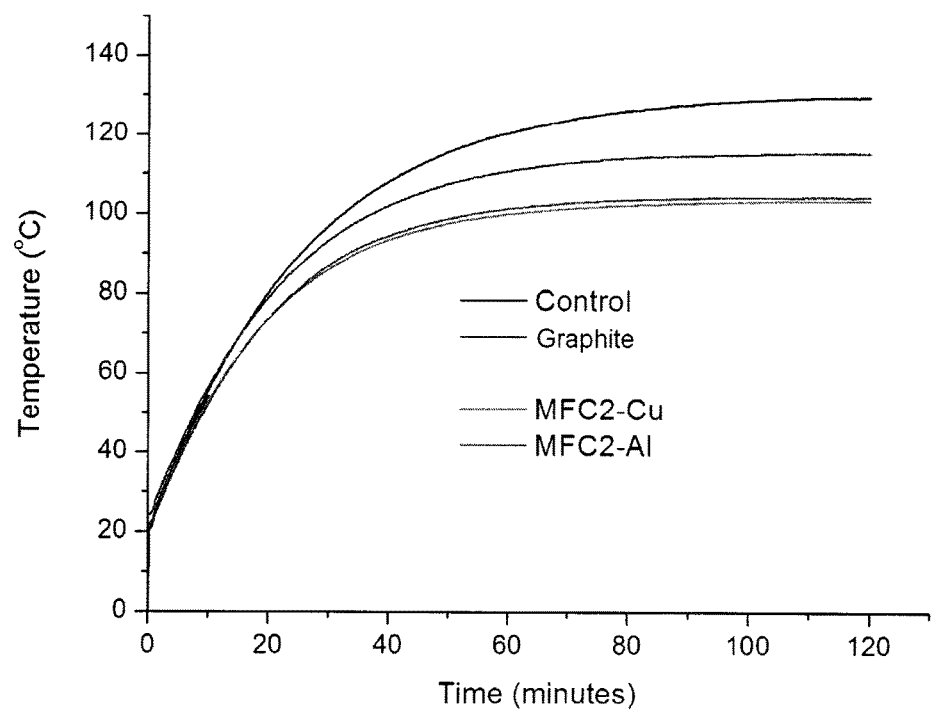
FIG. 9 illustrates the cooling effect of a heat dissipation foil on an aluminum substrate.

FIG. 9 illustrates the data shown in Table 3. The results indicate that heat dissipation foils are effective at providing radiative cooling when applied to a surface that requires heat dissipation, and that the heat dissipation foils provide superior heat dissipation as compared to a commercially-available heat dissipation film.

Example 4

Heat Dissipation in Low Pressure Environment

The cooling of the heat dissipation foils was measured in a low pressure environment to simulate aerospace use. A heat dissipation foil having a molecular fan film including carbon nanotubes, an aluminum foil flexible substrate and a pressure-sensitive adhesive was prepared. The heat dissipation foil was applied to a Q-Lab Q-PANEL® aluminum standard test substrate (Westlake, Ohio). An uncoated Q-PANEL® was used as a control.

A low pressure test included measurement of the temperature of the control aluminum and aluminum coated with the heat dissipation foil at 750 torr, 360 torr, 180 torr and 20 torr. Table 4 below shows cooling provided by the heat dissipation foil at various pressures:

TABLE 4

Cooling of heat dissipation foil at various pressures

| Pressure (torr) | Control (° C.) | Heat dissipation foil (° C.) | ΔT (° C.) |
|---|---|---|---|
| 750 | 118 | 93 | 25 |
| 360 | 139 | 105 | 34 |
| 180 | 153 | 114 | 39 |
| 20 | 182 | 131 | 51 |

Figure 6:
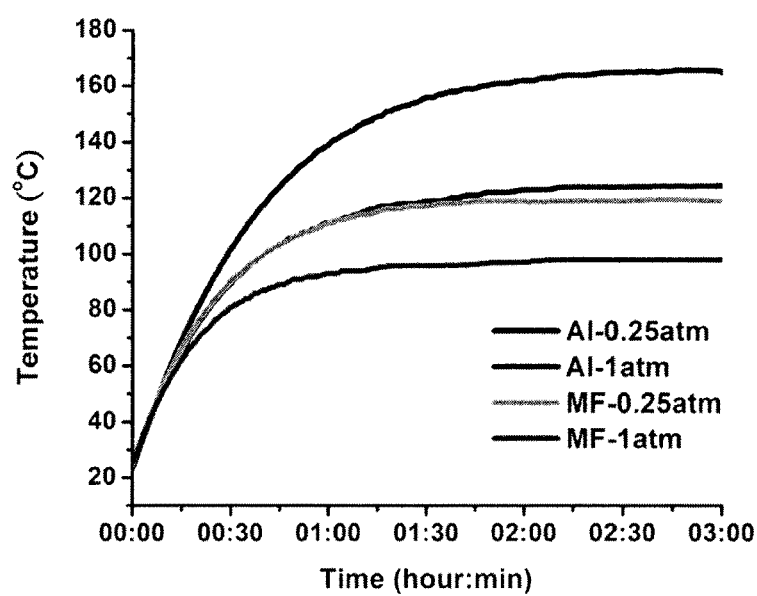
FIG. 6 illustrates the cooling effect of a heat dissipation foil at low pressure over time.

An extended low pressure test was performed by comparing the temperature of aluminum coated with the heat dissipation foil to the control aluminum at 1 atm and 0.25 atm over a period of 3 hours. FIG. 6 illustrates the cooling effect of a heat dissipation foil at low pressure over time. At 1 atm after 3 hours, the aluminum was 124° C. while the aluminum with the heat dissipation foil was 98° C., which indicates the heat dissipation foil provided 26° C. of cooling. At 0.25 atm after 3 hours, the aluminum was 165° C. while the aluminum with the heat dissipation foil was 119° C., which indicates the heat dissipation foil provided 46° C. of cooling.

Figure 7:
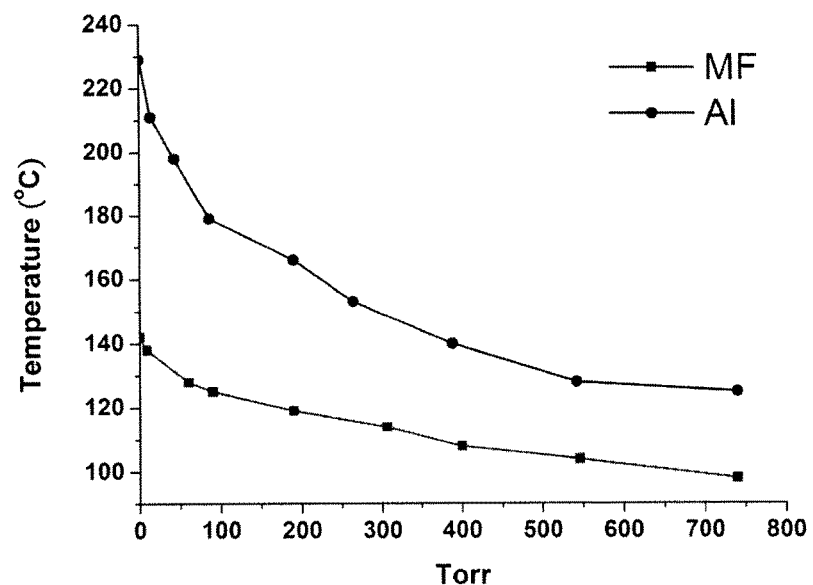
FIG. 7 illustrates the cooling effect of a heat dissipation foil at vacuum.

A vacuum pressure test was performed by comparing the temperature of the aluminum coated with the heat dissipation foil to the control aluminum at 1 atm and at a vacuum. FIG. 7 illustrates the cooling effect of a heat dissipation foil at vacuum. At 1 atm, the aluminum was 124° C. while the aluminum with the heat dissipation foil was 98° C., which indicates the heat dissipation foil provided 26° C. of cooling (21% temperature reduction). At vacuum, the aluminum was 229° C. while the aluminum with the heat dissipation foil was 142° C., which indicates the heat dissipation foil provided 87° C. of cooling (38% temperature reduction).

The results of the low pressure and vacuum tests show that the heat dissipation foil provides increased radiative cooling as pressure is decreased. The heat dissipation foil would be expected to provide good cooling in low pressure environments, such as aerospace and outer space environments. A molecular fan film, without a flexible substrate or adhesive, would also be expected to provide good cooling in low pressure environments.

REFERENCES

1. U.S. Pat. No. 5,332,870.
2. U.S. Pat. No. 6,649,090.
3. U.S. Pat. No. 7,015,280.
4. U.S. Pat. No. 7,931,969.
5. U.S. Pat. No. 8,545,933.
6. U.S. 2003/0151030.
7. U.S. 2004/0069454.
8. U.S. 2005/0179010.
9. U.S. 2007/0069373.
10. U.S. 2011/0232300.
11. Hsiao, T-J. et al., "Monolayer graphene dispersion and radiative cooling for high power LED", Nanotechnology, vol. 24 (2013).
12. Eyassu, T. et al., "Molecular cooling fan: factors for optimization of heat dissipation devices and applications", Industrial & Engineering Chemistry Research, vol. 53, pp. 19550-19558 (2014).
13. Suryawanshi, C. N. et al., "Radiative cooling: lattice quantization and surface emissivity in thin coatings", Applied Materials & Interfaces, vol. 1, no. 6, pp. 1334-1338 (2009).

What is claimed is:

1. A heat dissipation foil, comprising:
 a flexible substrate, having a working surface and an adhesive surface, opposite the working surface,
 a molecular fan film, on the working surface of the flexible substrate, and
 an adhesive, on the adhesive surface of the flexible substrate,
 wherein the molecular fan film is prepared by curing or drying a fluid including an emulsion that hardens upon curing and a surfactant,
 the molecular fan film is electrically insulating, and
 the molecular fan film comprises highly encapsulated monolayer graphene.

2. The heat dissipation foil of claim 1, wherein the adhesive is a pressure-sensitive adhesive.

3. The heat dissipation foil of claim 2, further comprising a removable liner, on the pressure-sensitive adhesive.

4. The heat dissipation foil of claim 1, wherein the flexible substrate comprises at least one member selected from the group consisting of metals, plastics and silicate minerals.

5. The heat dissipation foil of claim 1, wherein the flexible substrate comprises at least one member selected from the group consisting of aluminum, copper, polyethylene terephthalate, polyimide and mica.

6. The heat dissipation foil of claim 2, wherein the pressure-sensitive adhesive comprises an acrylic emulsion.

7. The heat dissipation foil of claim 1, wherein the adhesive is thermally conductive.

8. The heat dissipation foil of claim 3, wherein the removable liner comprises paper or plastic.

9. A method of making an electronic device having enhanced heat dissipation, comprising:
adhering the heat dissipation foil of claim 1 to the electronic device.

10. The method of claim 9, wherein the molecular fan film is in contact with a low pressure environment.

11. The method of claim 9, wherein the molecular fan film is in contact with a confined space.

12. An electronic device comprising the heat dissipation foil of claim 1.

13. The heat dissipation foil of claim 1, further comprising a removable liner, on the adhesive,
wherein the adhesive is a pressure-sensitive adhesive, and
the flexible substrate comprises at least one member selected from the group consisting of metals, plastics and silicate minerals.

14. The heat dissipation foil of claim 1, wherein the fluid further comprises a solvent.

15. The method of claim 9, wherein the electronic device is selected from the group consisting of desktop computers, notebook computers, tablet computers, television sets, video gaming consoles, mobile phones, liquid crystal displays, printed circuit boards, metal core printed circuit boards, light emitting diodes and high brightness light emitting diodes.

16. The electronic device of claim 12, wherein the electronic device is selected from the group consisting of desktop computers, notebook computers, tablet computers, television sets, video gaming consoles, mobile phones, liquid crystal displays, printed circuit boards, metal core printed circuit boards, light emitting diodes and high brightness light emitting diodes.

17. A method of making a heat dissipation foil having a flexible substrate, including a working surface and an adhesive surface, opposite the working surface; a molecular fan film, on the working surface of the flexible substrate; and an adhesive, on the adhesive surface of the flexible substrate, the method comprising:
forming an uncured molecular fan material;
applying the uncured molecular fan material to the working surface of the flexible substrate;
curing the uncured molecular fan material to form the molecular fan film on the working surface of the flexible substrate; and
applying the adhesive to the adhesive surface of the flexible substrate.

18. The method of claim 17, wherein the molecular fan film comprises highly encapsulated monolayer graphene.

19. The method of claim 17, wherein the molecular fan film is electrically insulating.

20. The method of claim 17, wherein the adhesive is a pressure-sensitive adhesive, and
the flexible substrate comprises at least one member selected from the group consisting of metals, plastics and silicate minerals.

* * * * *